United States Patent [19]

Schwabe et al.

[11] Patent Number: 4,510,670
[45] Date of Patent: Apr. 16, 1985

[54] METHOD FOR THE MANUFACTURE OF INTEGRATED MOS-FIELD EFFECT TRANSISTOR CIRCUITS SILICON GATE TECHNOLOGY HAVING DIFFUSION ZONES COATED WITH SILICIDE AS LOW-IMPEDANCE PRINTED CONDUCTORS

[75] Inventors: Ulrich Schwabe; Franz Neppl; Konrad Hieber, all of Munich, Fed. Rep. of Germany

[73] Assignee: Siemens Aktiengesellschaft, Berlin & Munich, Fed. Rep. of Germany

[21] Appl. No.: 458,533

[22] Filed: Jan. 17, 1983

[30] Foreign Application Priority Data

Mar. 30, 1982 [DE] Fed. Rep. of Germany ....... 3211761

[51] Int. Cl.³ ............................................ H01L 21/285
[52] U.S. Cl. ........................................ 29/571; 357/67;
357/71; 148/174
[58] Field of Search ............... 357/67 S, 71 S; 29/571;
148/174; 427/93, 95

[56] References Cited

U.S. PATENT DOCUMENTS

| 4,283,439 | 8/1981 | Higashinakagawa et al. | 427/93 |
| 4,330,931 | 5/1982 | Liu | 29/571 |
| 4,343,081 | 8/1982 | Lepsetter et al. | 29/571 |
| 4,359,490 | 11/1982 | Lehrer | 427/95 |
| 4,384,301 | 5/1983 | Tasch, Jr. et al. | 357/67 S |

FOREIGN PATENT DOCUMENTS 8020797  5/1981  United Kingdom ................ 29/571

OTHER PUBLICATIONS

Muraka "Refractory Silicides for Integrated Circuits" J. Vac. Sci. Technol., 17(4), Jul./Aug. 1980.
T. Shibata et al., Proceedings of IEMD 81, Paper No. 28.2, pp. 647 to 650, Entitled "An Optimally Designed Process for Submicron MOSFETS".
P. A. Gargini et al., Proceedings of IEMD 81, Paper No. 3.2, p. 54, Entitled "Low Resistance Self-Sligned Source, Drain and Gate Transistors".

Primary Examiner—Brian E. Hearn
Assistant Examiner—Hunter L. Auyang
Attorney, Agent, or Firm—Hill, Van Santen, Steadman & Simpson

[57] ABSTRACT

A method for the manufacture of integrated MOS-field effect transistor circuits in silicon gate technology and wherein diffusion source and drain zones are coated with a high melting point silicide as low-impedance printed conductors. The diffusion zones and polysilicon gates are made low-impedance through selective deposition of the metal silicide onto surfaces thereof. The selective deposition, which proceeds by use of a reaction gas eliminating hydrogen halide, simplifies the process sequence and is fully compatible with conventional silicon gate processes. Because of the high temperature stability, preferably tantalum silicide is employed. The invention is useful in the manufacture of MOS-circuits in VLSI-technology.

14 Claims, 6 Drawing Figures

METHOD FOR THE MANUFACTURE OF INTEGRATED MOS-FIELD EFFECT TRANSISTOR CIRCUITS SILICON GATE TECHNOLOGY HAVING DIFFUSION ZONES COATED WITH SILICIDE AS LOW-IMPEDANCE PRINTED CONDUCTORS

BACKGROUND OF THE INVENTION

The invention relates to a method for the manufacture of integrated MOS field effect transistor circuits in silicon gate technology wherein the diffused zones are rendered low-impedance by means of a layer consisting of metal silicides having a high melting point; hence the layers are useful as printed conductors. After completion of a polysilicon plane and the production of regions of the circuit serving as source/drain zones, the metal silicide is produced through direct deposition on the semiconductor substrate provided with the MOS structures.

A reduction of the structure sizes of integrated MOS circuits also requires a reduction of the depth of diffusion zones. Accordingly, the layer resistance becomes considerably increased. This leads to undesirably high delay times in the case of $n^+$-silicon conductors, and to high source/drain-series resistances which impair the function of short channel transistors.

These difficulties can be avoided through a self-adjusting silicidation of diffusion zones. There is the possibility, in the same method step, of also providing the polysilicon gates with silicide (polycide-gate). From an article by T. Shibata et al from the Proceedings of IEDM 81, paper No. 28.2, page 647 to 650, incorporated herein by reference, it is known to employ platinum silicide for this purpose, which is produced through reaction of a vapor-deposited platinum and a silicon substrate. The disadvantages of this method are:

(a) a consumption of substrate silicon during the silicidation, as a consequence of which a short-circuit danger exists to the substrate given flat diffusion zones;

(b) the temperature stability is guaranteed only for temperatures smaller than 800° C.;

(c) a costly metallization system with a diffusion barrier is necessary; multiple layer etching problems arise; and (d) the process is not compatible with hydrofluoric acid-containing chemicals.

The short-circuit danger can be avoided through deposition of platinum/silicon mixtures or platinum/tungsten mixtures. Accordingly, in the case of platinum/tungsten, only at the low temperatures the consumption of substrate—silicon is reduced. However, self-adjustment is lost and photolithography steps become necessary.

As self-adjusting alternatives, also a selective tungsten deposition (see P. A. Gargini, J. Beinglass, Proceedings of IEDM 81, Paper No. 3.2, page 54), incorporated herein by reference, was also proposed. Consecutive or following processes, however, are restricted to less than 500° C. since otherwise tungsten silicide formation with silicon consumption in the contact occurs. In the case of flat diffusion zones, this again has, as a consequence, the possibility of substrate short-circuits.

SUMMARY OF THE INVENTION

The invention solves in another fashion the problem posed for the use of metal silicides for the reduction of the layer resistance of the diffusion zones in the case of VLSI (very large scale integration)—processes with very flat diffusion zones in the substrate. Specifically, prior to the production of the insulation oxide between the external printed conductor plane and the metal silicide plane, the metal silicide layer structure is produced through selective deposition from the gas phase onto the silicon surface regions of the substrate by use of a reaction gas which produces hydrogen halide during the thermal decomposition. It is within the scope of the invention to employ as metal silicides the silicides of tantalum, tungsten, titanium, and molybdenum.

Through the method according to the invention, the diffusion zones in the substrate and the polysilicon gate regions are provided in a self-adjusting manner with silicide through selective deposition of high-melting silicides such as tantalum silicide. These zones and regions are thereby rendered low-impedance ($3\Omega/\square$). Thus, the possibility is provided of manufacturing MOS field effect transistors with low source/drain series resistances. Moreover, through the selective deposition of the silicide, a photolighography process is dispensed with. With use of tantalum silicide, a good adhesion results. The system tantalum silicide/silicon is stable at temperatures of 1,000° C. For this reason, the inventive method is fully compatible with the conventional metallization processes of silicon gate technology. No diffusion barriers are needed.

In the following, on the basis of FIGS. 1 through 6, two different process operating sequences are described in greater detail which represent particularly favorable sample embodiments according to the teaching of the invention. In the figures, by sectional view, only the method steps which are significant in terms of the invention are illustrated; and the same parts are provided with the same reference numbers.

DESCRIPTION OF THE PREFERRED EMBODIMENTS

Figure 1:
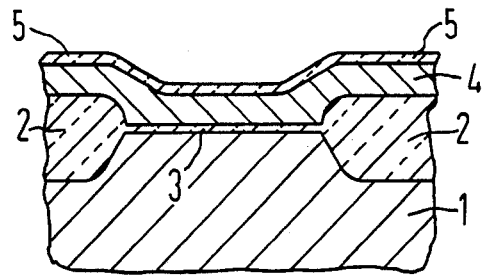
FIGS. 1 through 4 relate to the manufacturing operation of an MOS field effect transistor in which, for the prevention of oxidation on the polysilicon surface, a nitride layer has been employed.

FIG. 1: On a monocrystalline, p-doped (100)-orientated silicon substrate disk 1 with a specific resistance in the range of 2 to 50$\Omega$.cm, with the aid of the known LOCOS-technique (nitride coating, nitride structuring), after completed field implantation, field oxide regions 2 ($d_{ox}=700$ nm) and active regions are defined. After removal of the nitride mask, through oxidation in the active regions, the gate oxide 3 is produced in a layer thickness of 40 nm. Subsequently, through a CVD process (chemical vapor deposition) a 500 nm-thick polysilicon layer 4 is deposited over the entire surface and, with phosphorus, is $n^+$ doped. Subsequently, on the polysilicon layer 4, a silicon nitride layer 5 in a layer thickness of e.g. 100 nm is deposited over the entire surface.

Figure 2:
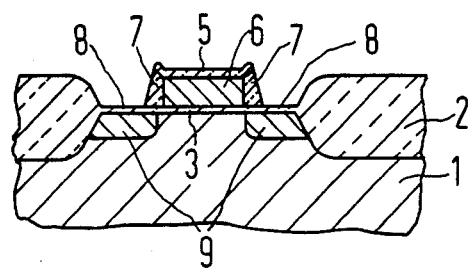

FIG. 2: The silicon nitride layer 5, with the polysilicon layer 4 disposed therebelow, is etched to form the polysilicon gate electrode 6 and subsequently the monocrystalline substrate 1 surfaces and the polysilicon gate side-walls are again provided with an oxide layer 7 through thermal oxidation. Consequently, at the edges of the highly-doped polysilicon region 6, a layer thickness of 200 nm results. At the remaining monocrystalline regions shown at 8 of the substrate 1, a layer thickness of 60 nm results. There now follows an arsenic-ion implantation for producing the n+-doped source/drain regions 9.

Figure 3:
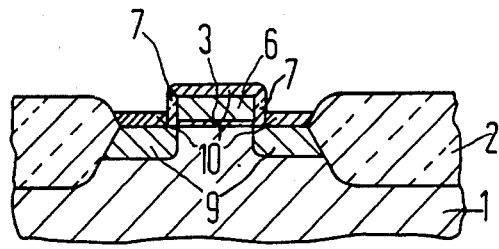

FIG. 3: The nitride layer 5, serving as a mask, is now removed and an entire surface-wide oxide etching is conducted, whereby the oxide layer 8 is entirely removed. There remain 140 nm oxide on the gate sidewalls, which later provide insulation between silicide on the source/drain zones and the gate, respectively. Then the significant step in terms of the invention of selective deposition of tantalum silicide 10 over the substrate surface regions and gate 6 takes place. With this deposition, tantalum silicide is deposited from the gas phase from a reaction gas mixture which produces hydrogen chloride, whereby the pressure, the deposition temperature, and the composition of the reaction gas are adjusted to values at which, through the presence of the hydrogen chloride during the thermal decomposition, with the exception of the surface regions of the substrate consisting of silicon, a crystal nucleus formation in the other regions is suppressed. The mixing proportion consisting of tantalum chloride, hydrogen, and a halogenated silane compound (for example, dichloro silane ($SiH_2Cl_2$)), is adjusted to 1:10:2. The pressure is set at 133 Pa, and the substrate temperature (1) is set to 850° C. The growth rate of the tantalum sillicide layer 10 amounts to 100 nm/min. The layer thickness is adjusted to 300 nm. Thus, the electric sheet resistance is set between 1.5 to 3$\Omega$/□ (area unit).

Figure 4:
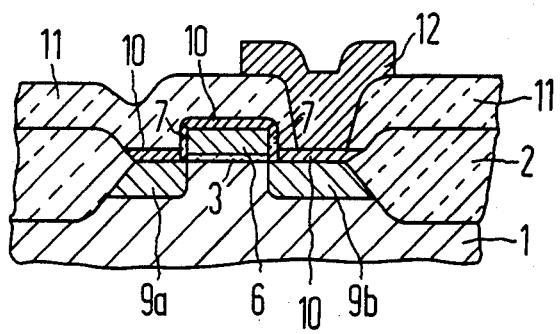

FIG. 4: Following the selective silicide 10 deposition there takes place the deposition of the intermediate oxide 11 which serves as an insulation oxide between the tantalum silicide plane 10 and a metallization plane 12. This can proceed, for example, through a CVD deposition in a layer thickness of 1000 nm. Only the contact for the n+ region 9b, covered with tantalum silicide 10, is opened and the printed conductor plane 12, consisting of aluminum/silicon, is produced in a known fashion.

Figure 5:
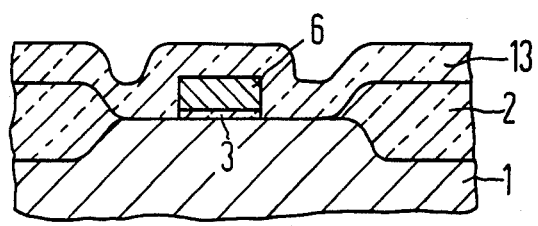
FIGS. 5 and 6 represent an alternate embodiment in which a process sequence differing from FIGS. 1 and 2 is provided whereby, following the structuring of the polysilicon gate electrode, a CVD-oxide-deposition and an anisotropic etching process has been carried out.

FIG. 5: In another version of the inventive method, after carrying out the LOCOS-process (production of the field oxide regions 2 on the substrate 1, definition of the active regions), and after carrying out the gate oxidation 3 (as described in the case of FIG. 1), through a CVD-process a 500 nm-thick polysilicon layer is deposited, doped with phosphorus, and structured in the form of a polysilicon gate electrode 6. After removal of the gate oxide layer in the region of the substrate surface not covered by the gate electrode 6, there then takes place an entire-surface CVD oxide deposition, whereby the $SiO_2$-layer 13 results.

Figure 6:
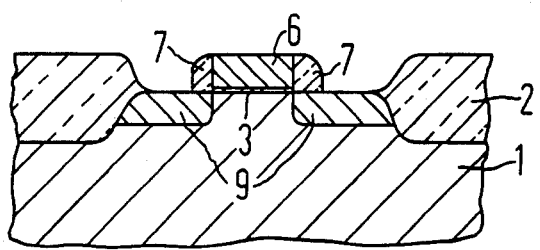

FIG. 6: Subsequently, the CVD-$SiO_2$ 13 is subjected to an anisotropic etching process, whereby the edges of the highly-doped polysilicon gate electrode 6 remain covered with an oxide layer 7. This etching process can proceed, for example, through reactive ion etching. The following arsenic ion implantation in the transistor region for the production of the monocrystalline n+-doped source and drain zones 9 then proceeds as described in the case of FIG. 2.

All further method steps, from the selective deposition of the tantalum silicide layer 10 to the metallization process, are described with reference to FIGS. 3 and 4 as well as their related descriptions.

Although various changes and modifications might be proposed by those skilled in the art, it will be understood that we wish to include within the claims of the patent warranted hereon all such changes and modifications as reasonably come within our contribution to the art.

We claim as our invention:

1. A method for the manufacture of integrated MOS field effect transistor circuits in silicon gate technology, in which diffused zones are rendered low-impedance by use of a layer lying thereon in physical contact therewith comprised of a metal silicide having a high melting point, and which are useful as printed conductors, comprising the steps of:

producing insulation regions on a surface of a silicon substrate to define an active transistor region with source and drain zones, and providing an insulating layer for a gate above the active region;

providing a polysilicon gate above the gate insulating layer and providing an insulation layer on sidewalls of the gate;

providing the source and drain zones in the substrate;

producing by use of the previously provided insulation layers in self-adjusting fashion without deposition occurring on the insulation layers a metal silicide layer in direct contact with and only on the source and drain zones and gate comprised of silicon through selective deposition from a gas phase and by use of a reaction gas mixture having a silane compound and a metal halide along with a hydrogen halide during thermal decomposition, a crystal nucleus formation in the insulation layers being suppressed so that etching is not needed;

providing an insulating layer over the metal silicide layer; and providing appropriate exterior contact printed conductors which are in contact with a portion of the metal silicide layer where necessary through holes selectively etched in the oxide layer.

2. The method of claim 1 wherein the metal silicide layer is also deposited in direct contact with the gate when it is applied in direct contact with the source and drain zones.

3. A method according to claim 1, including the step of employing a silicide selected from the group consisting of tantalum, tungsten, titanium, and molybdenum for said metal silicide layer.

4. A method according to claim 1 including the step of adjusting a thickness of the silicide layer to 200 to 500 nm, and adjusting a sheet resistance of the source and drain zones by use of tantalum silicide to 1.5 to 3$\Omega$/□ (area unit).

5. A method for the manufacture of integrated MOS field effect transistor circuits, comprising the steps of:

(a) manufacturing structured $SiO_2$ layers on a p-doped semiconductor substrate for separation of the active transistor regions according to a so-called LOCOS method or iso-planar method;

(b) forming a gate insulating layer by oxidation of a free portion of the p-substrate surface;

(c) depositing an entire-surface polysilicon layer comprised of n+ doping substances and structuring the polysilicon gate therefrom;

(d) removing the gate oxide layer in a region of the substrate surface not covered by the gate;

(e) depositing an SiO₂ layer from the gas phase with a CVD-method;

(f) anisotropically etching the SiO$_2$-layer so that edges of the silicon gate remain covered by the oxide;

(g) carrying out an arsenic ion implantation at the substrate surface on both sides of the gate for the production of the monocrystalline n+-doped source and drain zones in the p-doped substrate;

(h) depositing in self-adjusting manner tantalum silicide from the gas phase pursuant to use of a reaction gas mixture which produces hydrogen chloride during the reaction, so that the tantalum silicide is deposited only on the surface regions of the substrate which are comprised of silicon and not on insulating layers since crystal nucleus formation is suppressed there;

(i) depositing an insulation layer acting as an intermediate oxide;

(j) etching hole contact regions for the exterior contact metal printed conductor to the silicized silicon source or drain zones of the substrate; and (k) carrying out metallization and structuring of the exterior contact metal printed conductor.

6. A method according to claim 5 wherein as the substrate a (100)-oriented, p-doped, silicon crystal with a specific resistance of 2 to 50Ω.cm is employed.

7. A method according to claim 5 wherein the thickness of the CVD-oxide according to method step (e) is adjusted to 100 to 1000 nm.

8. A method for the manufacturing of integrated MOS field effect transistor circuits, comprising the steps of:

(a) manufacturing structured SiO₂ layers on a p-doped semiconductor substrate for separation of active transistor regions according to a so-called LOCOS method or isoplanar method;

(b) carrying out a gate oxidation through oxidation of a free portion of the p-substrate surface;

(c) depositing an entire-surface polysilicon layer and doping this layer with n+-doping substances;

(d) depositing a silicon nitride layer on the polysilicon layer and structuring this double layer comprised of the silicon nitride layer and polysilicon layer to form the gate;

(e) carrying out a thermal oxidation whereby an oxide layer develops on free surfaces of the silicon substrate, and at edges of the highly-doped polysilicon gate a thicker oxide layer being formed than on the substrate;

(f) carrying out an arsenic-ion implantation in the transistor region for generation of monocrystalline n+-doped source and drain zones in the p-doped substrate;

(g) removing the nitride layer;

(h) conducting an entire-surface etching-away of the oxide layer on the substrate surface until the substrate is exposed;

(i) depositing in self-adjusting manner a tantalum silicide layer from the gas phase by use of a reaction gas mixture which produces hydrogen chloride during the reaction, so that the tantalum silicide is deposited only on the surface regions of the substrate which are comprised of silicon and not on insulating layers since crystal nucleus formation is suppressed thereon;

(j) depositing on the structure completed thus far an insulating layer acting as an intermediate oxide;

(k) etching contact holes to permit the exterior metal printed conductor to contact at least one of the silicized silicon zones of the substrate; and (l) carrying out metallization and structuring of the exterior contact metal printed conductor.

9. A method according to claim 8 wherein the thickness of the oxide layer according to method step (e) is adjusted to approximately 200 nm.

10. A method according to claim 8 wherein the etching-away of the oxide according to method step (h) creates a layer thickness of approximately 60 nm.

11. A method for the manufacture of integrated MOS field effect transistors in silicon gate technology, comprising the steps of:

providing a silicon substrate;

forming in and at a surface of the silicon substrate insulation regions to define an active transistor region, and providing a thin gate oxide layer at the active transistor region;

providing a polysilicon gate over the gate insulating layer and providing insulation at side-walls of the gate;

doping the substrate at both sides of the gate to form drain and source zones;

producing in self-adjusting fashion by use of the insulation a metal silicide layer to render the diffused drain and source zones low-impedance by selectively depositing from a gas phase only onto surfaces of the silicon drain and source zones and gate and not onto the insulation by using a reaction gas mixture comprising a silane compound along with a hydrogen halide during thermo-decomposition, a crystal nucleus formation on the insulation being suppressed;

providing an insulating layer over the metal silicide layer; and forming a contact hole through the insulating layer to a portion of the metal silicide layer for contacting the silicide layer to external metallization.

12. The method of claim 11 wherein the metal silicide layer is also selectively deposited on a top of the gate along with being deposited on the surface of the source and drain zones.

13. A method according to claim 11 wherein the hydrogen halide comprises hydrogen chloride.

14. A method according to claim 13 wherein the metal silicide layer is produced with a mixing proportion of tantalum chloride, hydrogen and a halogenated silane compound of dichloro silane.

* * * * *